United States Patent
Cooper et al.

(10) Patent No.: US 11,469,333 B1
(45) Date of Patent: Oct. 11, 2022

(54) COUNTER-DOPED SILICON CARBIDE SCHOTTKY BARRIER DIODE

(71) Applicant: SemiQ Incorporated, Lake Forest, CA (US)

(72) Inventors: James A. Cooper, Santa Fe, NM (US); Rahul R. Potera, Irvine, CA (US)

(73) Assignee: SEMIQ INCORPORATED, Lake Forest, CA (US)

( * ) Notice: Subject to any disclaimer, the term of this patent is extended or adjusted under 35 U.S.C. 154(b) by 61 days.

(21) Appl. No.: 16/794,774

(22) Filed: Feb. 19, 2020

(51) Int. Cl.
  *H01L 29/06* (2006.01)
  *H01L 29/872* (2006.01)
  *H01L 29/16* (2006.01)

(52) U.S. Cl.
  CPC ........ *H01L 29/872* (2013.01); *H01L 29/0607* (2013.01); *H01L 29/1608* (2013.01)

(58) Field of Classification Search
  CPC combination set(s) only.
  See application file for complete search history.

(56) References Cited

U.S. PATENT DOCUMENTS

| | | |
|---|---|---|
| 3,775,200 A | 1/1973 | De Nobel et al. |
| 4,543,595 A | 9/1985 | Vora |
| 4,745,445 A | 5/1988 | Mun et al. |
| 4,946,547 A | 8/1990 | Palmour et al. |
| 5,200,022 A | 4/1993 | Kong et al. |
| 5,602,418 A | 2/1997 | Imai et al. |
| 5,612,567 A | 3/1997 | Baliga |
| 5,686,738 A | 11/1997 | Moustakas |
| 5,741,724 A | 4/1998 | Ramdani et al. |

(Continued)

FOREIGN PATENT DOCUMENTS

| | | |
|---|---|---|
| CN | 101689561 | 3/2010 |
| EP | 0081414 | 6/1983 |

(Continued)

OTHER PUBLICATIONS

Arulkumaran et al. "Studies on the Influences of I-GaN, N-GaN, P-GaN and InGaN Cap Layers in AlGaN/GaN High-Electron-Mobility Transistors," Japanese Journal of Applied Physics, Japan Society of Applied Physics, JP, vol. 44, No. 5A, May 10, 2005, pp. 2953-2960, XP001502490, ISSN: 0021-4922.

(Continued)

*Primary Examiner* — Moin M Rahman
(74) *Attorney, Agent, or Firm* — The Law Offices of Bradley J. Bereznak

(57) ABSTRACT

A Schottky diode includes an upper region having a first doping concentration of a first conductivity type, the upper region disposed above the SiC substrate and extending up to a top planar surface. First and second layers of a second conductivity type are disposed in the upper region adjoining the top planar surface and extending downward to a depth. Each of the first and second layers has a second doping concentration, the depth, first doping concentration, and second doping concentration being selected such that the first and second layers are depleted of carriers at a zero bias condition of the Schottky diode. A top metal layer disposed along the top planar surface in direct contact with the upper region and the first and second layers is the anode, and bottom metal layer disposed beneath the SiC substrate is the cathode, of the Schottky diode.

5 Claims, 5 Drawing Sheets

(56) References Cited

U.S. PATENT DOCUMENTS

| | | |
|---|---|---|
| 5,785,606 A | 7/1998 | Marquez |
| 5,874,747 A | 2/1999 | Redwing et al. |
| 5,877,558 A | 3/1999 | Nakamura et al. |
| 6,051,340 A | 4/2000 | Kawakami et al. |
| 6,121,121 A | 9/2000 | Koide |
| 6,139,628 A | 10/2000 | Yur et al. |
| 6,146,457 A | 11/2000 | Solomon |
| 6,184,570 B1 | 2/2001 | MacDonald, Jr. et al. |
| 6,239,033 B1 | 5/2001 | Kawai |
| 6,685,804 B1 | 2/2004 | Ikeda et al. |
| 7,026,665 B1 | 4/2006 | Smart et al. |
| 7,235,330 B1 | 6/2007 | Fujimoto et al. |
| 7,547,928 B2 | 6/2009 | Germain et al. |
| 7,696,540 B2 | 4/2010 | Francis et al. |
| 7,696,598 B2 | 4/2010 | Francis et al. |
| 8,901,699 B2 | 12/2014 | Ryu et al. |
| 2002/0015833 A1 | 2/2002 | Takahashi et al. |
| 2003/0015708 A1 | 1/2003 | Parikh et al. |
| 2004/0016965 A1 | 1/2004 | Ui et al. |
| 2004/0021152 A1 | 2/2004 | Nguyen et al. |
| 2004/0119063 A1 | 6/2004 | Guo et al. |
| 2005/0087763 A1 | 4/2005 | Kanda et al. |
| 2006/0108606 A1 | 5/2006 | Saxler et al. |
| 2006/0151868 A1 | 7/2006 | Zhu et al. |
| 2006/0186422 A1 | 8/2006 | Gaska et al. |
| 2006/0244010 A1 | 11/2006 | Saxler |
| 2007/0045764 A1* | 3/2007 | Hatakeyama ......... H01L 29/872 257/471 |
| 2009/0039456 A1* | 2/2009 | Bhalla ................ H01L 29/872 257/E27.068 |
| 2009/0191674 A1 | 7/2009 | Germain et al. |
| 2011/0278599 A1* | 11/2011 | Nakao ................ H01L 29/1095 257/77 |
| 2014/0048847 A1* | 2/2014 | Yamashita ............. H01L 29/36 257/140 |
| 2015/0028350 A1* | 1/2015 | Suvorov .............. H05K 999/99 257/77 |
| 2019/0006526 A1* | 1/2019 | Kitada ................ H01L 29/0634 |
| 2019/0267370 A1* | 8/2019 | Sato .................... H01L 29/0847 |

FOREIGN PATENT DOCUMENTS

| | | |
|---|---|---|
| EP | 0514018 | 11/1992 |
| EP | 1612866 | 1/2006 |
| FR | 2844099 | 3/2004 |
| JP | 11040847 | 2/1992 |
| JP | 08050922 | 2/1996 |
| JP | 09306504 | 11/1997 |
| JP | 11135115 | 5/1999 |
| JP | 11145514 | 5/1999 |
| JP | 2000216409 | 8/2000 |
| JP | 2000512075 | 9/2000 |
| JP | 2001357855 | 12/2001 |
| JP | 2002083594 | 3/2002 |
| JP | 2003506903 | 2/2003 |
| JP | 2005209377 | 8/2005 |
| JP | 2006155959 | 6/2006 |
| WO | 9641906 | 12/1996 |
| WO | 0131722 | 5/2001 |
| WO | 0143174 | 6/2001 |
| WO | 03032397 | 4/2003 |
| WO | WO-2017188105 A1 * | 11/2017 ............. H01L 29/24 |

OTHER PUBLICATIONS

Hashizume Tamotsu et al. "Chemisty and Electrical Properties of Surfaces of GaN and GaN/AlGaN Heterostructures," Journal of Vacuum Science and Technology: Part B, AVS/AIP, Melville, New York, NY, US, vol. 19, No. 4, Jul. 1, 2001, pp. 1675-1681, XP012008931.

Yoshida et al. "A New GaN Based Field Effect Schottky Barrier Diode with a Very Low On-Voltage Operation," Proceedings of 2004 Power Semiconductor Devices & ICs, Kitakyushu, May 24, 2004, pp. 323-326, XP010723404, ISBN: 978-4-88686-060-6.

\* cited by examiner

| Temp (K) | P Counter Doping (/cm3) | P Thickness (μm) | Barrier Height (ev) | IL_1200 (A) | IL_200 (A) | IL_400 (A) | IL_800 (A) |
|---|---|---|---|---|---|---|---|
| 300 | 0 | 0 | 1.24 | 4.34E-06 | 7.77E-14 | 6.36E-12 | 1.90E-08 |
| 300 | 1.00E+16 | 0.1 | 1.24 | 2.98E-06 | 4.98E-14 | 3.48E-12 | 9.32E-09 |
| 300 | 2.00E+16 | 0.1 | 1.24 | 2.33E-06 | 3.93E-14 | 2.48E-12 | 6.21E-09 |

COUNTER-DOPED SILICON CARBIDE SCHOTTKY BARRIER DIODE

TECHNICAL FIELD

The present disclosure relates to silicon carbide power semiconductor devices. More specifically, the present invention relates to silicon carbide Schottky Barrier Diode (SBD) and Junction Barrier Schottky (JBS) diode structures capable of withstanding high voltages.

BACKGROUND

The Schottky diode (named after German physicist Walter H. Schottky) is a well-known semiconductor diode device that is achieved using a metal-semiconductor junction, frequently referred to as a Schottky barrier, in contrast to an ordinary PN junction of a conventional semiconductor diode. Compared with silicon-based PIN diodes, silicon carbide (SiC) Schottky barrier diodes (SBDs) are characterized by lower switching losses and very fast switching speed. However, SIC devices, due to their wider bandgap, are optimized to operate at higher electric fields. The leakage current across the reverse-biased metal-semiconductor junction in the SiC SBD at this higher electric field is much higher than leakage across a PN junction of the same barrier in a Si PIN diode.

Switching loss is low because, unlike silicon PIN diodes, SiC SBDs are majority carrier devices that do not inject minority carriers into the N-type drift region. Since these carriers do not need to be removed to switch the device off, the reverse current transient during switching is small and the switching energy is negligible. This reduction in switching energy has led to SIC SBDs replacing silicon PIN diodes in many power applications such as the front-end boost converter in switched-mode power supplies. One drawback with using SiC SBDs instead of Si PIN diodes is enhanced reverse-biased leakage current.

Silicon SBDs are generally unsuitable for high voltage operation because their reverse leakage current is relatively high, leading to high off-state power dissipation. Even though the leakage current is much smaller in SiC SBDs as compared to silicon SBDs, reverse leakage in SiC SBDs is still a performance limitation. The leakage is due to electrons that enter the semiconductor material from the metal by thermionic-field emission (TFE) under reverse bias. This leakage current increases exponentially with the electric field at the metal-semiconductor interface, i.e., where the semiconductor material directly contacts the metal forming the anode of the diode. The electric field is given by the slope of the conduction band at the surface.

Prior attempts to reduce the reverse leakage current in SiC SBDs have focused on reducing the electric field at the surface. One past approach has been to place isolated P+N junctions within the active area of the SBD. Such devices are commonly referred to as Junction-Barrier Schottky (JBS) diode structures. In JBS diodes, many of the electric field lines reaching the surface terminate on P+N junctions rather than on the Schottky junction, thus reducing the surface electric field and hence lowering the reverse leakage current. One drawback of this approach, however, is that the insertion of P+N junctions increases the overall area of the diode for the same current-carrying area of the Schottky junction, and thus increases the specific on-resistance in forward bias, and capacitance in reverse bias.

FIG. 1 is a cross-sectional view of a conventional prior art JBS diode 10 that includes a top metal layer 11 in direct contact with a N-type drift region 14 at a top surface 13 of the semiconductor material. Top metal layer 11 forms the anode of JBS diode 10. Deep P+ regions 12a & 12b are shown disposed at opposite lateral sides of top surface 13. An N+ layer 15 vertically separates N-type drift region 14 from a bottom metal layer 16, which forms the cathode of JBS diode 10.

In JBS diode 10 deep P+ regions 12a & 12b are highly doped to a concentration of 1E19/cm3 to 1E21/cm3, which is about 1000 times higher or more than the doping concentration of N-type drift region 14. P+ regions 12a & 12b are typically formed to a vertical depth of 200 nm to 500 nm or more, with each P+ region having a lateral width of about 2.0 μm. In conventional JBS diode 10 P+ regions 12a & 12b are typically laterally separated by a distance of about 2.0 μm.

As discussed above, even though the JBS leakage current is less than that of a SiC SBD, the magnitude of the reverse bias leakage current still causes problems in certain applications. Furthermore, the addition of the highly-doped P+ regions reduces the Schottky diode contact area. The reduced contact area results in forward bias current reduction.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIG. 6 is chart showing reverse-bias leakage current performance results for two embodiments of the JBS diode illustrated in FIG. 3 versus the conventional JBS diode of FIG. 1.

Figure 1:
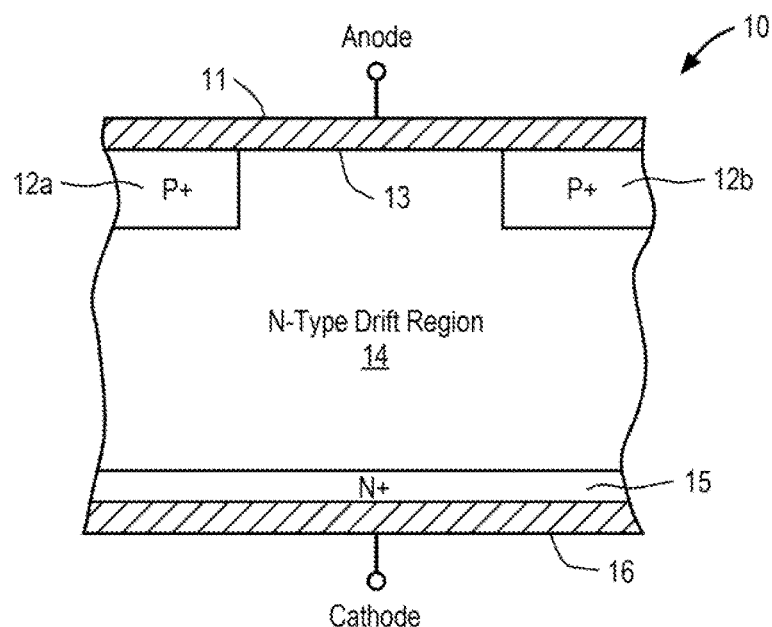
FIG. 1 is a cross-sectional diagram of a conventional JBS diode.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the disclosed subject matter. Also, common but well-understood elements that are useful or necessary in a commercially feasible embodiment are often not depicted in order to facilitate a less obstructed view of these various embodiments presented. Additionally, persons of skill in the semiconductor arts will understand that regions and elements depicted in cross-sectional diagrams should not be limited to the particular shapes of the regions illustrated. For instance, implanted regions shown in rectangular form typically have rounded or curved features due to normal fabrication processing. Thus, the shapes of regions shown in the drawings are not intended to illustrate the precise shapes found in a manufactured device.

DETAILED DESCRIPTION

In the following description numerous specific details are set forth in order to provide a thorough understanding of the disclosed subject matter. It will be apparent, however, to one having ordinary skill in the art that the specific details need not be employed to practice the various embodiments described. In other instances, well-known systems, devices, or methods have not been described in detail in order to avoid obscuring the disclosed subject matter.

Reference throughout this specification to "one embodiment", "an embodiment" "one example" or "an example" means that a particular feature, structure or characteristic described in connection with the embodiment or example is included in at least one embodiment of the disclosed subject matter. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As used herein, a "wafer" is a thin slice of crystalline material, such as silicon carbide, used in the fabrication of semiconductor devices and integrated circuits. The term "substrate" refers to the semiconductor supporting material upon which or within which the elements of a semiconductor device are fabricated, which substantially comprises the thickness of a wafer. Upon completion of the fabrication process the wafer is typically scribed and broken into individual semiconductor die, each of which consists of one or more semiconductor devices.

In the context of the present application, when a diode is in an "off state" or "off" the diode does not substantially conduct current. Conversely, when a diode is in an "on state" or "on" the diode is able to substantially conduct current in a forward-biased direction.

It is appreciated that each the diode structures shown and disclosed herein may represent a single device cell or unit. Each of the diode cells shown may be replicated in a mirrored or translated fashion many times in in two-dimensional layouts across a wafer to form a completely fabricated SiC device.

A SiC counter-doped Schottky diode that incorporates a relatively thin or shallow P-type layer at the surface of the semiconductor layer to substantially reduce the surface electric field, and hence the reverse-bias leakage current, is described. The doping and thickness of the P-type layer are determined to insure that the P-type layer is completely depleted at zero bias. In the off-state, the negatively-charged acceptors in the depleted P-type layer reduce the electric field at the Schottky metal interface, thereby reducing the reverse leakage. It has been demonstrated that the counter-doped Schottky diode disclosed herein has a lower electric field at the surface as compared with a conventional Schottky diode. Compared to a conventional JBS diode, the counter-doped Schottky diode has a Schottky interface over the entire anode and hence conducts with lower resistance in forward bias.

Figure 2:
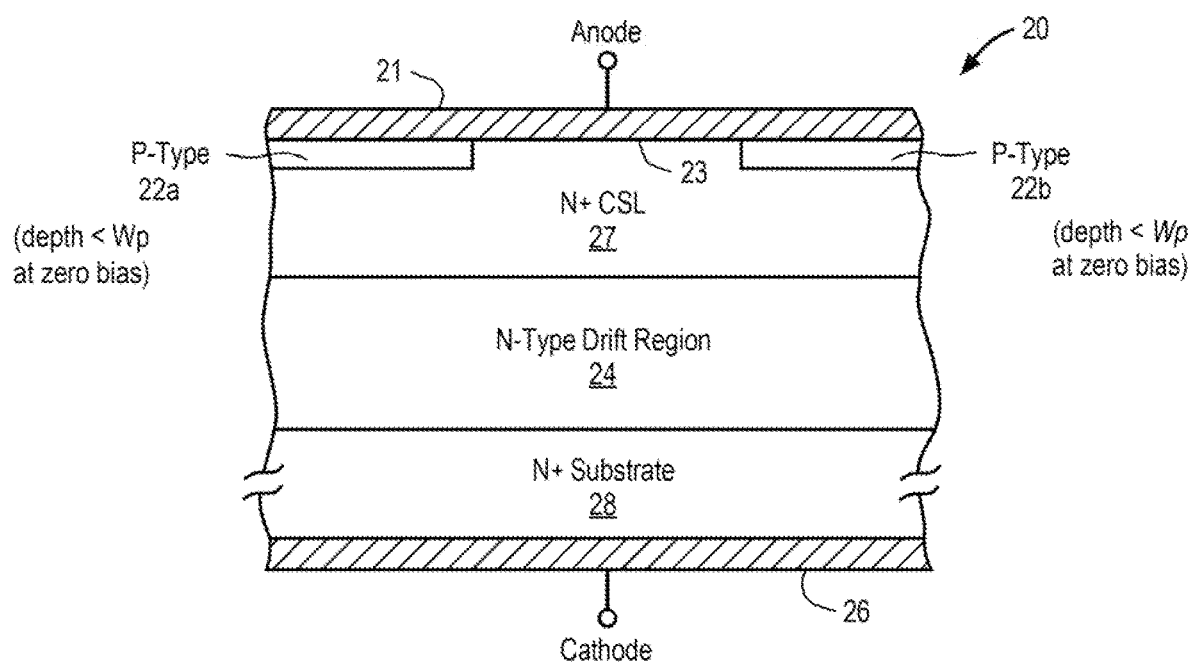
FIG. 2 is an example cross-sectional diagram of a SiC diode with a counter-doped Schottky barrier.

FIG. 2 is an example cross-sectional diagram of a SBD 20 fabricated in a SiC wafer. As shown, SBD 20 includes a counter-doped Schottky barrier having spaced-apart, shallow P-type layers or regions 22a & 22b disposed at a top planar semiconductor surface 23 beneath and in direct contract with top metal layer 21, which forms the anode of SBD 20. Metal layer 21 may comprise titanium or other suitable Schottky metal, e.g., molybdenum nitride.

By way of example, in a typical 1200 V counter-doped Schottky barrier diode, P-type regions 22a & 22b are shown disposed in an upper N+ current spreading layer (CSL) or region 27 to predetermined implant depth of about 100 nm, or less, beneath top planar surface 23. Each P-type region may have a doping concentration in a range of about 1E16/cm$^3$ to 2E16/cm$^3$. Within this combined doping range and thickness, P-type regions 22a & 22b are fully depleted at zero bias, so as to avoid introducing an additional forward voltage drop in the on-state (forward biased).

In one embodiment, the lateral width of P-type regions 22a & 22b is about 500 nm. P-type region 22a is laterally separated from P-type region 22b by a distance of about 0.5 µm. It should be appreciated that SBD 20 with shallow P-type regions 22 effectively reduces the electric field at surface 23 without impacting forward bias current. Unlike the conventional JBS diode structure shown in FIG. 1, in SBD 20 the entire region beneath top metal layer 21 is available for forward conduction. In other words, because P-type regions 22a & 22b are very shallow and fully depleted in forward bias, the entire region directly beneath top metal layer 21 acts as a Schottky diode.

Practitioners in the art will further appreciate that compared with conventional JBS diodes SBD 20 has an advantage of being much narrower in pitch while reducing reverse bias leakage current considerably, but without a significant reduction in forward current.

Continuing with the example of FIG. 2, N+ CSL 27 extends vertically from top planar surface 23 down to an N-type drift region 24. N-type drift region 24 separates N+ CSL 27 from underlying N+ SiC substrate 28. A bottom metal layer 26, which is disposed directly beneath N+ SiC substrate 28, forms the cathode of SBD diode 20.

In one embodiment, for a 1200 volt diode N-type drift region 24 may have a doping concentration of about 9E15/cm$^3$ and a thickness of about 10 µm. SiC substrate 28 may have a doping concentration of about 4E18/cm$^3$ and a thickness in a range of 100 µm to 360 µm.

It is appreciated that in other embodiments the depth or thickness of P-type regions 22a & 22b may be less than or slightly greater than 100 nm (e.g., 120 nm) while still insuring that P-type regions 22a & 22b are fully depleted at zero bias. Considering only depletion due to the PN junctions, the extent or width $W_P$ the depletion region in each of P-type regions 22a & 22b is given as $$W_P = \sqrt{\frac{2\varepsilon_S}{qN_A}\frac{kT}{q}\left(\frac{N_D}{N_A + N_D}\right)\ln\left(\frac{N_A N_D}{n_i^2}\right)}$$

where $N_A$ and $N_D$ are the doping concentrations of the P-type and N-type regions 22 and 27, respectively, $\varepsilon_S$ is the semiconductor dielectric constant, q is the electronic charge, k is Boltzmann's constant, T is absolute temperature, and $n_i$ is the intrinsic carrier concentration at temperature T. For a given P-type doping $N_A$, keeping the thickness (depth) of each P-type region 22 less than $W_P$ insures that each P-type region 22 is totally depleted at zero bias.

In counter-doped SBD 20, the holes in the P-type regions 22 are depleted by diffusing both to the N-type region 27 on one side, and to the top metal layer 21 on the other side where they recombine with free electrons. When the anode is raised to a positive potential the depletion region in each of the shallow, counter-doped P-type regions 22 contracts from both ends. However, by careful selection of the top metal and the combined doping concentration and thickness, each counter-doped P-type region 22 is kept depleted even at the rated forward bias operating condition of the diode.

Conversely, when the anode is negative the depletion region of the PN junction expands into each P-type region 22. Thus, if P-type regions 22 are totally depleted at a zero bias condition, they remain depleted at all non-zero reverse biases.

Practitioners in the art will appreciate that to a first order, inclusion of shallow P-type regions 22 beneath top metal layer 21 has a minimal effect on the on-state (forward bias) performance of diode 20. In reverse bias the electric field at the metal-semiconductor interface is substantially reduced in counter-doped SBD 20, as compared with conventional SBD devices.

It should also be noted that in certain embodiments the P-type region 22 doping-thickness product may be less than $N_A \times W_P$. For example, the doping of P-type regions 22 can be reduced to zero (an intrinsic layer), or even become slightly N-type provided that remains more lightly doped than N-type drift region 24.

It is further appreciated that in still other embodiments N+ CSL 27 may optionally be eliminated such that the N-type drift region 24 extends upward to top surface 23.

Figure 3:
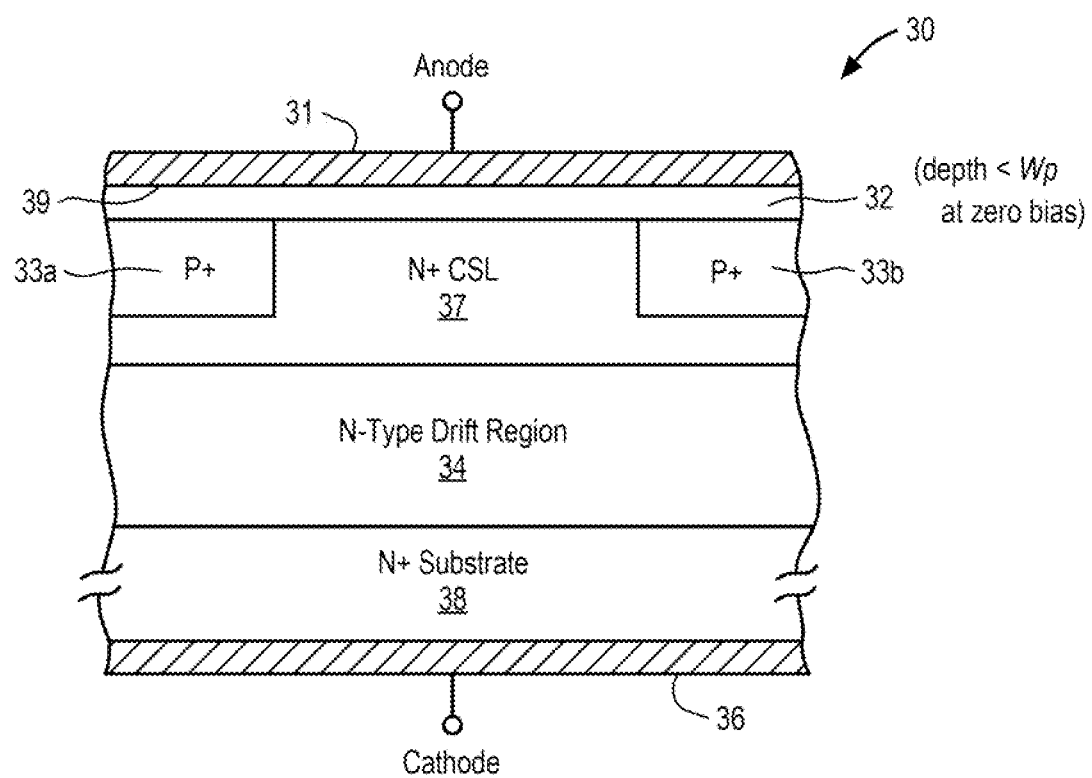
FIG. 3 is an example cross-sectional diagram of a JBS diode with counter-doping in the Schottky region.

FIG. 3 an example cross-sectional diagram of a JBS diode 30 with counter-doping in the Schottky region. The device structure of JBS diode 30 includes a single shallow, implanted P-type region or layer 32 that extends laterally across the top SiC surface 39. Top metal layer 31 (anode) is disposed above, and in direct contact with, P-type layer 32, which, in one embodiment, is formed via ion implantation to a depth of about 100 nm, or less, beneath surface 39. Disposed beneath P-type layer 32 are laterally spaced-apart, highly-doped deep P+1B$ regions 33a & 33b.

In one embodiment, P+ JBS regions 33 are disposed in N+ CSL region 37 with each having a lateral width of about 2.0 μm and a vertical depth typically of about 0.3 μm to 1.5 μm. In certain embodiments, P+ JBS regions may be formed to a depth of 1.0 μm. P+ JBS regions 33a & 33b may be doped to a concentration of $1E19/cm^3$ to $2E20/cm^3$. N+ CSL 27 extends vertically from top surface 39 down to an N-type drift region 34. N-type drift region 34 vertically separates N+ CSL 37 from underlying N+ SiC substrate 38. A bottom metal layer 36, which is disposed directly beneath N+ SiC substrate 38, forms the cathode of JBS diode 30.

As was the case with SBD 20 shown in FIG. 2, P-type layer 32 of JBS diode 30 has a doping concentration and depth that is selected such that P-type layer 32 is completely depleted of carriers at zero bias. Because shallow P-type layer 32 extends across top surface 39 beneath the entire lateral width of metal layer 31 the electric field at top surface 39 is substantially reduced under reverse bias, as compared with conventional JBS devices, thereby decreasing leakage current.

Practitioners skilled in the art will appreciate that the inclusion of P-type layer 32 beneath top metal layer 31 advantageously improves on-state (forward bias) performance of JBS diode 30, as compared with conventional JBS devices. In addition, the incorporation of shallow P-type layer 32 in combination with heavily-doped, deep P+ JBS regions 33 functions to further reduce reverse bias leakage current as compared to the prior art JBS diodes.

FIG. 6 is chart showing reverse-bias leakage current performance results for two embodiments of the JBS diode illustrated in FIG. 3 versus the conventional JBS diode of FIG. 1. The reverse-bias performance results for the conventional JBS diode with no shallow counter-doped P-type layer is shown at the top of the chart. The reverse-bias performance results for two embodiments of a 1200 V rated JBS diode having shallow, P-type counter-doping—with respective doping/thickness combinations of $1E16/cm^3/100$ nm and $2E16/cm^3/100$ nm—are shown on the bottom two lines of the chart. As can be seen, the counter-doped JBS diodes provide significantly reduced reverse bias leakage current at all voltages.

Figure 4:
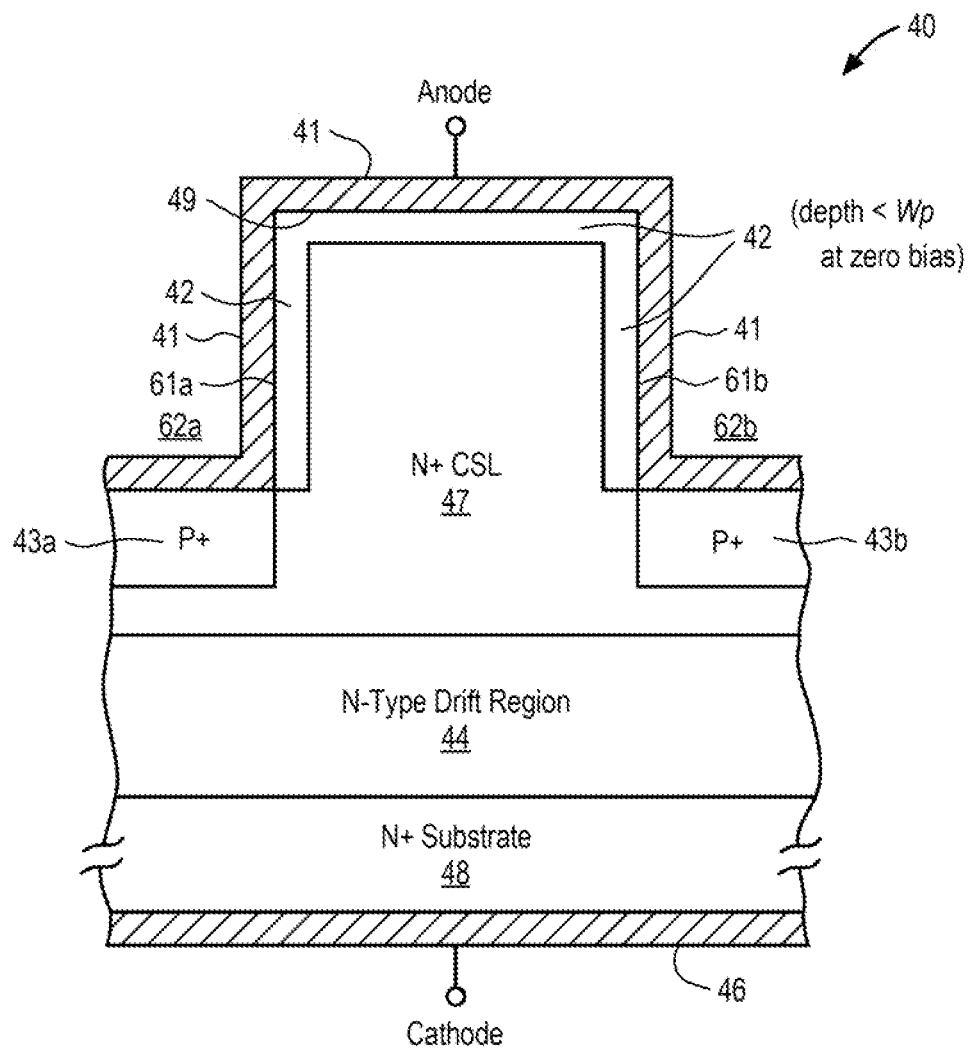
FIG. 4 is an example cross-sectional diagram of a trench JBS diode where the sidewalls of the trench and top surface of the SiC mesa are counter-doped.

FIG. 4 is an example cross-sectional diagram of a trench JBS diode 40 fabricated by deeply etching areas of N+ CSL 47 to form a semiconductor (SiC) mesa defined by respective trenches 62a and 62b. The mesa comprises a top portion of N+ CSL 47 that includes vertical sidewalls 61a & 62b respectively disposed on opposite sides of the mesa. Sidewalls 61 and the top surface 49 of the SiC mesa are counter-doped via ion implantation to form a shallow P-type region or layer 42 that extends vertically along sidewalls 61 and horizontally beneath top surface 49. It is appreciated that sidewall counter-doping may be performed by angled ion implants that form P-type layer 42 along sidewalls 61a & 61b, during which time top surface 49 is masked.

After removal of the masking layer a vertical implant may be performed to form the horizontal portion of P-type layer 42 beneath top planar surface 49. Following formation of the counter-doped horizontal and vertical portions of P-type layer 42, top metal layer 41 may be formed directly on P-type layer 42 on both the top and sidewall portions of the mesa, as well at the bottom of trenches 62 in contact with P+ regions 43. Top metal layer 41 forms a Schottky contact which functions as the anode of trench JBS diode 40.

Like the previous embodiments discussed above, shallow P-type layer 42 may be formed to a depth or thickness of about 100 nm or less along the top and sidewall areas of the SiC mesa. For a given top metal type (e.g., titanium), the depth and doping concentration of P-type layer 42, along with the doping concentration of N+ CSL 47 are selected to insure that P-type layer 42 is fully depleted at zero applied bias.

Also shown in FIG. 4, are heavily-doped P+ JBS regions 43a & 43b respectively disposed directly beneath the bottom of trenches 62a & 62b. In one embodiment, the doping of P+ JBS regions 43 is in a range of about $1E19/cm^3$ to $2E20/cm^3$. The depth of each P+ region 43 may typically be about 0.2-0.4 μm for trenches 62 etched to a depth in a range from about 0.5-1.0 μm.

Note that in the example of FIG. 4 the depth of each P+ JBS region 43 does not extend to the bottom of N+ CSL 47, which is directly above N-type drift region 44. N-type drift region 44 vertically separates N+ CSL 47 from underlying N+ SiC substrate 48. A bottom metal layer 46, which is disposed directly beneath N+ SiC substrate 48, forms the cathode of trench JBS diode 40.

Persons of skill in the art will understand that N+ CSL 47 may optionally be omitted in certain embodiments such that N-type drift region 44 extends vertically from substrate 48 to the counter-doped P-type layer 42 at the top of the mesa. In one embodiment, N+ CSL 47, when included, has a doping concentration is a range from about 2E16/cm³ to 1E17/cm³. In the example of FIG. 4 the SiC mesa may have a height (equal to the depth of trenches 62) in a range of about 0.5-1.0 μm, and a lateral width of about 1.0-2.0 μm.

It is appreciated that in trench JBS diode 40 shown in FIG. 4, shielding of the electric field in reverse bias from the implanted P+ JBS regions 43 at the bottom of the trench is enhanced by the shallow counter-doping implant utilized to form P-type layer 42 along the vertical sidewall portions and horizontal top portion of the SiC mesa. Electric field shielding is provided from the trench bottom P+ JBS regions 43, and from the shallow P-type layer 42 disposed along sidewalls 61, as well as from shallow P-type layer 42 disposed at top planar surface 49 of the SiC mesa, which surface forms a Schottky barrier contact.

Figure 5:
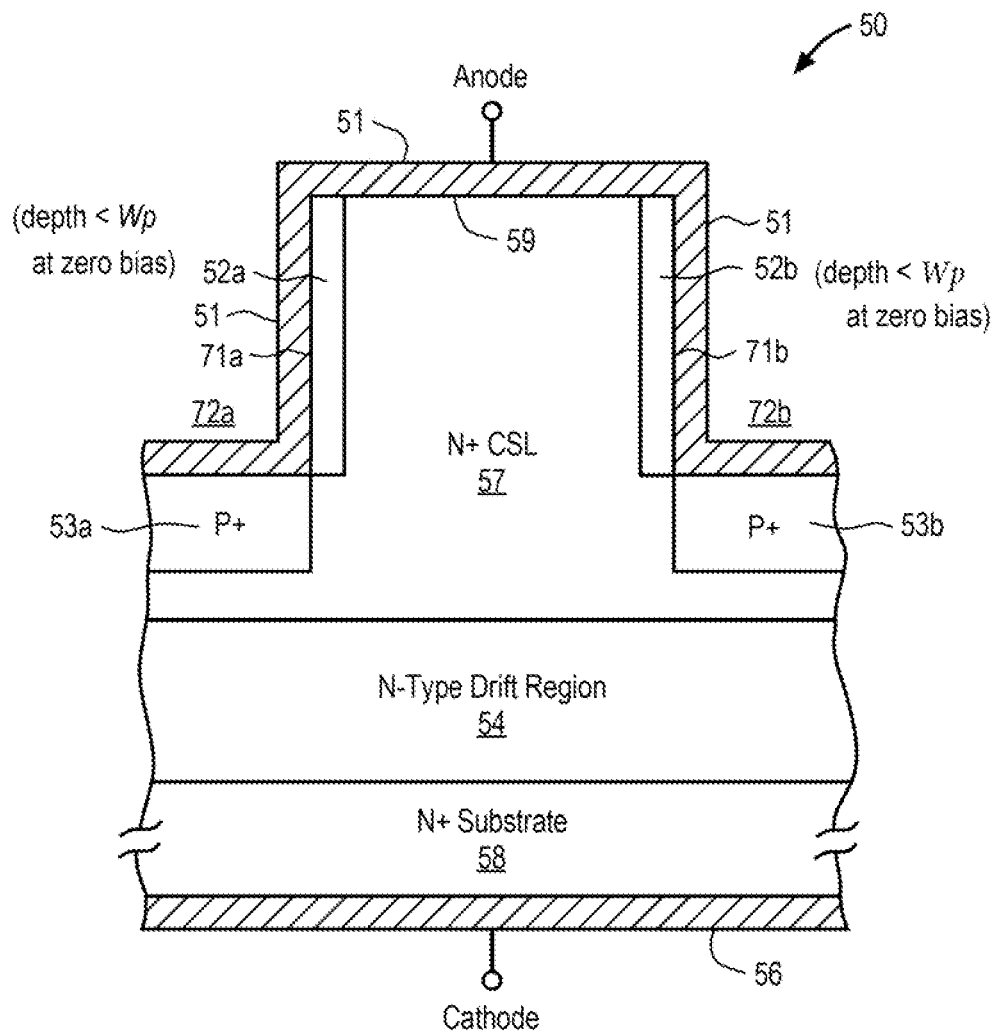
FIG. 5 is an example cross-sectional diagram of another trench JBS diode where the sidewalls of the trench are counter-doped and the top surface of the SiC mesa is not counter-doped.

FIG. 5 is an example cross-sectional diagram of another trench JBS diode 50 where the sidewalls 71a & 71b of trenches 72a & 72b are counter-doped by implant to form shallow vertical sidewall P-type regions or layers 52a & 52b, respectively. Top planar surface 59 of the SiC mesa comprising N+ CSL 57 is not counter-doped. Top metal layer 51 directly contacts the mesa-top as well as the top of P-type regions 52a & 52b at top surface 59 of the SiC mesa. Top metal layer 51 also contacts the P-type regions 52 on the trench sidewalls as well as the P+ JBS implant regions at the bottom of trenches 72.

The example trench JBS diode 50 of FIG. 5 is identical to trench JBS diode 40 shown in FIG. 4 in all respects except that the shallow P-type counter-doped layer is omitted at the horizontal mesa-top area of N+ CSL 57. That is, top surface 59 of N+ CSL 57 directly contacts top metal layer 51. P+ JBS regions 53a & 53b are formed beneath trenches 72a & 72b. Each P+ JBS region 53 shields both the sidewall Schottky barrier and the mesa-top Schottky barrier. Practitioners will appreciate that P-type counter-doped regions 52 along the mesa sidewalls adds to the shielding of the Schottky barrier at the mesa-top by the JBS regions 53.

Persons of ordinary skill will understand that the sidewall Schottky barrier is exposed to higher electric fields than the mesa-top, but it also has a higher effective Schottky barrier due to the counter-doped P-type regions 52 disposed along the vertical sidewall areas; hence, P-type regions 52 further shield the mesa-top Schottky barrier.

The depth and doping concentration of P-type regions 52, disposed along the sidewalls of the mesa are selected, along with the doping concentration of N+ CSL 57, to insure that, for a given top metal type, P-type regions 52 are fully depleted at zero bias. As shown, N-type drift region 54 is formed over N+ SiC substrate 58. A bottom metal layer 56, which is disposed directly beneath N+ SiC substrate 58, forms the cathode of trench JBS diode 50.

Persons of skill in the art will understand that N+ CSL 57 is optional and may be omitted in certain embodiments, such that N-type drift region 54 extends vertically from substrate 58 to top surface 59 of the mesa. In one embodiment, N+ CSL 57 has a doping concentration is a range from about 2E16/cm³ to 1E17/cm³. In the example of FIG. 5 the SiC mesa has a height (depth of trenches 72) in a range of about 0.5-1.0 μm, and a lateral width of about 1.0-2.0 μm.

The above description of illustrated example embodiments, including what is described in the Abstract, are not intended to be exhaustive or to be limited to the precise forms or structures disclosed. While specific embodiments and examples of the subject matter described herein are for illustrative purposes, various equivalent modifications are possible without departing from the broader spirit and scope of the present invention. Indeed, it is appreciated that the specific example thicknesses, material types, concentrations, voltages, etc., are provided for explanation purposes and that other values may also be employed in other embodiments and examples in accordance with the teachings of the present invention.

We claim:

1. A Junction-Barrier Schottky (JBS) diode comprising:
a silicon carbide (SiC) substrate of a first conductivity type;
an upper region having a first doping concentration of the first conductivity type, the upper region being disposed above the SiC substrate and beneath a top planar surface;
a single shallow layer of a second conductivity type disposed above the upper region and adjoining the top planar surface, the single shallow layer extending vertically from the top planar surface downward to a first depth, the single shallow layer having a second doping concentration, the first depth, the first doping concentration, and the second doping concentration being determined to insure that the single shallow layer is completely depleted at a zero bias condition of the JBS diode;
a top metal layer disposed along the top planar surface in direct contact with the single shallow layer, the top metal layer comprising an anode of the JBS diode, a Schottky interface being formed between the single shallow layer and the top metal layer across the anode;
first and second deep regions of the second conductivity type, the first and second deep regions being disposed in the upper region directly beneath and adjoining the single shallow layer, the first and second deep regions extending vertically downward to a second depth substantially greater than the first depth, the first and second deep regions being laterally spaced-apart, each of the first and second deep regions having a lateral width and a third doping concentration substantially greater than the second doping concentration;
a bottom metal layer disposed beneath the SIC substrate, the bottom metal layer comprising a cathode of the JBS diode; and
wherein the upper region comprises an N+ current spreading layer (CSL), and further comprising an N-type drift region disposed beneath the N+ CSL, the N-type drift region vertically separating the N+ CSL from the SiC substrate.

2. The Schottky diode of claim 1 wherein the first depth is about 100 nm or less, and the second depth is in a range of about 0.3 μm to 1.5 μm.

3. The Schottky diode of claim 2 wherein the second doping concentration is in a range of about 1E16/cm³ to 2E16 cm³, and the third doping concentration is in a range of about 1E19/cm³ to 2E20/cm³.

4. The Schottky diode of claim 2 wherein the lateral width of each of the first and second deep regions is about 2.0 μm.

5. The Schottky diode of claim 1 wherein the first conductivity type is N-type and the second conductivity type is P-type.

* * * * *